United States Patent
Hayashi

(10) Patent No.: US 7,483,460 B2
(45) Date of Patent: Jan. 27, 2009

(54) TRANSMITTER OPTICAL SUBASSEMBLY AND A TRANSMITTER OPTICAL MODULE INSTALLING THE SAME

(75) Inventor: Shigeo Hayashi, Kanagawa (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 11/496,713

(22) Filed: Aug. 1, 2006

(65) Prior Publication Data
US 2007/0071045 A1 Mar. 29, 2007

(30) Foreign Application Priority Data
Aug. 4, 2005 (JP) .................... P.2005-227240

(51) Int. Cl.
*H01S 3/00* (2006.01)
(52) U.S. Cl. .................... 372/38.1; 372/38.07
(58) Field of Classification Search ............ 359/285; 372/38.1, 38.02, 38.07, 38.04, 38.09
See application file for complete search history.

(56) References Cited

U.S. PATENT DOCUMENTS

2005/0111503 A1* 5/2005 Ishigami et al. ............ 372/38.1
2005/0207459 A1* 9/2005 Yu et al. ..................... 372/36
2006/0187983 A1* 8/2006 Baba et al. ................. 372/38.07
2006/0262822 A1* 11/2006 Tatum ........................ 372/38.1

FOREIGN PATENT DOCUMENTS

| JP | 05-082904 | 4/1993 |
| JP | 05-082906 | 4/1993 |
| JP | 05-218572 | 8/1993 |
| JP | 09-197158 | 7/1997 |
| JP | 2001-015854 | 1/2001 |
| JP | 2001-320121 | 11/2001 |
| JP | 2004-179591 | 6/2004 |

* cited by examiner

*Primary Examiner*—Minsun Harvey
*Assistant Examiner*—Tuan N. Nguyen
(74) *Attorney, Agent, or Firm*—Smith, Gambrell & Russell, LLP

(57) ABSTRACT

To provide a transmitter optical subassembly that provides an enhanced high-frequency response without increasing the power consumption within a CAN-type package. The transmitter optical subassembly includes a semiconductor laser diode, an auxiliary circuit, and a package for installing the semiconductor laser diode and the auxiliary circuit. The auxiliary circuit generates a transient signal synchronized with the leading edge or falling edge of a driving signal for the semiconductor laser diode in an electrode of the semiconductor laser diode for a very short period in order to boost the response speed of the semiconductor laser diode. The auxiliary circuit operated intermittently so that it is not necessary to consider heat caused by the auxiliary circuit even in case the auxiliary circuit is installed in the package.

5 Claims, 7 Drawing Sheets

TRANSMITTER OPTICAL SUBASSEMBLY AND A TRANSMITTER OPTICAL MODULE INSTALLING THE SAME

BACKGROUND OF THE INVENTION

1. Technical Field

The present invention relates to a transmitter optical subassembly and a transmitter optical module installing the same.

2. Related Prior Art

In general, it is known, as configurations to connect a device for switching a current supplied from a current source among the semiconductor laser diode (LD) driver systems, a series configuration where switching devices are inserted in series to a light-emitting device and a shunt configuration where switching devices are inserted in parallel to a light-emitting device. A Japanese Patent application published as JP-2001-015854A discloses a typical example of series configuration. The shunt configuration has advantageous in that it uses a smaller number of devices than the series configuration and allows high-speed operation, while the shunt configuration has a drawback that the degree of modulation permitted is small and the controllability of a current is poor.

A Japanese Patent application published as JP-2004-179591A discloses another LD driver. This driver reflects the switching status of the reference current, which flows in the reference current path of the current mirror circuit, by toggling the switch connected to the reference current path, to the current supplied to the LD connected to the other current path of the current mirror circuit. In order to make steep the leading edge and the falling edge of the mirrored current supplied to the LD, a circuit is added that generates a pulse current synchronous with the leading edge and the falling edge of a signal to select the switching state. With this additional circuit, the LD driver increases/decreases the transient currents on the edges of the signal to perform high-speed LD switching.

Optical communications in recent years reaches a transmission speed exceeding 10 Gbps. In the high-speed transmission range over 10 Gbps, the frequency response of the wiring connecting a light-emitting device and a driver, that is, the transmission impedance becomes important. Especially, a waveform may be degraded by the parasitic inductance of a lead pin in a transmitter optical subassembly. Or, the leading edge or the falling edge of a signal may be delayed by a parasitic capacitance.

To solve these problems, a package with good controllability of the transmission impedance, for example, a butterfly package is used as a package for a transmitter optical subassembly. However, the butterfly package is expensive and is not effective in terms of high-speed transmission when the light emitting device is directly driven. For indirect modulation system that uses a MZ (Mach-Zender modulator) or an EA modulator (Electro-absorption modulator), the termination of a signal line may be easily and reliably carried out. For a system for directly modulating a light-emitting device, the internal resistance of the light-emitting device becomes 3 to 30 ohms in the case of a laser diode (LD). When a resistor of 1 to 40 ohms is serially inserted to the LD to terminate the transmission line, the inserted resistor and the junction capacitance of the light-emitting device constitute an integrator, which causes a problem in the high-speed transmission.

It is known, what is called, a CAN-type package as another form for the optical subassembly. The CAN-type package is less expensive than the butterfly package. A problem with the CAN-type package is that impedance matching of a lead pin is hard to ensure and the high-speed modulation is difficult. Another problem is the heat dissipation characteristic of a driver when a driver is installed within the CAN-type package. The CAN-type package has less tolerance freedom in terms of its shape and specifications including its diameter, the number of pins and LD installation method than the butterfly package. When a driver is installed within the CAN-type package, it is difficult to efficiently dissipate the heat of the driver out of the package. Large quantity of heat generated in a transmitter optical subassembly increases the temperature of the LD, which degrades the light emission characteristic and the reliability of the optical assembly.

The invention relates to a transmitter optical subassembly that may improve a high-frequency performance without increasing the power consumption of the transmitter optical subassembly and an optical data link installing the same.

SUMMARY OF THE INVENTION

An aspect of the invention relates to a transmitter optical subassembly. The transmitter optical subassembly comprises a light-emitting device including an anode electrode and a cathode electrode, a CAN-type package including a plurality of lead pins, and an auxiliary circuit. The light-emitting device and the auxiliary circuit are installed within a package and a driving signal is supplied through a lead pin. The auxiliary circuit according to the invention generates a transient current synchronous with either the leading edge or falling edge of the driving signal in the anode electrode or cathode electrode of the light-emitting device.

The transient current synchronous with the transition timing of the driving signal is supplied to a light-emitting device so that a quicker response is achieved in the light-emitting device. The auxiliary circuit includes a differentiator (low-frequency cut-off filter) for differentiating a driving signal and a transistor for generating a transient current by receiving the output of the differentiator. According to the invention, the auxiliary circuit is installed within the CAN-type package, however, current flows through the auxiliary circuit only for a short period of time while the driving signal is transmitted and thus heat generation by the current is not necessary to be considered.

Another aspect of the invention relates to a transmitter optical module. The transmitter optical module includes a driver and a transmitter optical subassembly. The driver is provided outside the transmitter optical subassembly and receives an electrical signal and outputs a driving signal. The transmitter optical subassembly includes a semiconductor laser diode, an auxiliary circuit, and a CAN-type package installing the semiconductor laser diode and the auxiliary circuit. The package has a plurality of lead pins and the driving signal is supplied to the semiconductor laser diode through one of the lead pins as well as to the auxiliary circuit. The auxiliary circuit generates a transient current in the anode electrode of the semiconductor laser diode in synchronous with the leading edge of the driving signal.

In the transmitter optical module according to the invention, a driver may be separated to a first driver and a second driver, and the output of the first driver or a first driving signal may be supplied to the anode electrode of the semiconductor laser diode installed within the transmitter optical subassembly through the first lead pin and the output of the second driver or a second driving signal may be supplied to the auxiliary circuit installed within the transmitter optical subassembly through the second lead pin. Because the first and the second drivers are used, an optimum condition can be set for each of the semiconductor laser diode and the auxiliary circuit.

In the transmitter optical module according to the invention, a current source for generating a bias current may be provided outside the transmitter optical subassembly. By supplying the first driving signal superimposed with the bias current to the anode electrode of the semiconductor laser diode, it is possible to bias the semiconductor laser diode without increasing the number of lead pins in the transmitter optical subassembly.

The first driving signal may be supplied to the cathode electrode of the semiconductor laser diode and the auxiliary circuit may bypass the current supplied to the semiconductor laser diode in synchronous with the leading edge of the second driving signal. Further, a photodiode for monitoring the optical output from the semiconductor laser diode may be installed within the transmitter optical subassembly according to the invention and the output of the photodiode may be extracted through the second lead pin for inputting the second driving signal. Any of the new features of the transmitter optical subassembly are implemented without increasing the number of lead pins.

DESCRIPTION OF PREFERRED EMBODIMENTS

Figure 1:
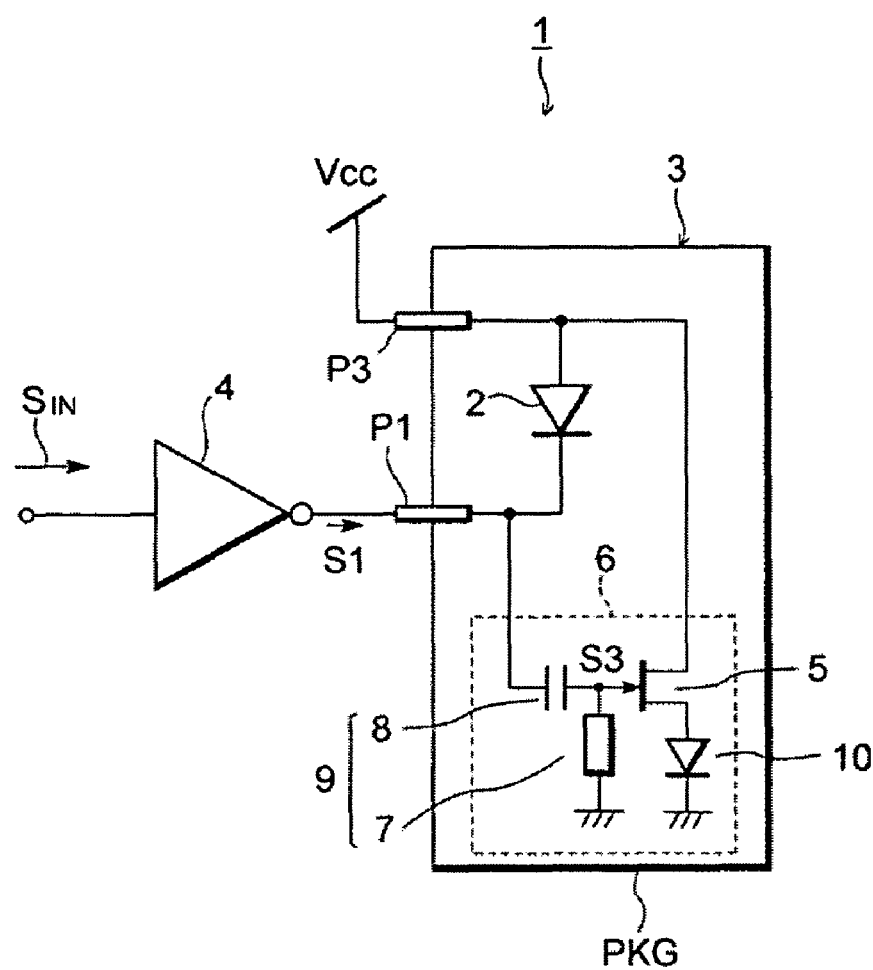
FIG. 1 shows the circuit configuration of a transmitter optical subassembly and a transmitter optical module according to a first embodiment.

Preferred embodiments of the transmitter optical subassembly according to the invention will be detailed referring to the drawings. In the description of drawings, the same or corresponding elements are given the same symbol and duplicated description is omitted.

First Embodiment

FIG. 1 shows the configuration of a transmitter optical subassembly 3 as a first embodiment of the invention. FIG. 1 also shows a transmitter optical module 1 having the transmitter optical subassembly 3 and converting a high-frequency driving signal input from outside to an optical signal and outputting the resulting optical signal.

The transmitter optical subassembly 3 comprises an LD (light-emitting device) 2, a CAN-type package PKG. installing the LD 2, and an auxiliary circuit including an n type FET 5. The transmitter optical module 1 includes the transmitter optical subassembly 3 and a driver 4 arranged outside the package PKG.

The driver 4 receives a signal $S_{IN}$ input from outside the transmitter optical module 1 and outputs a driving signal S1. The driving signal S1 is supplied to the cathode electrode of the LD 2 in the package of the transmitter optical subassembly 3 and the auxiliary circuit 6 through a lead pin P1 provided in the package PKG of the transmitter optical subassembly 3.

The auxiliary circuit 6 includes the n type FET 5, a differentiator 9 configured with a resistor 7 and a capacitor 8 connected between the gate of the FET 5 and the input of the auxiliary circuit 6, and a diode 10 that is connected to the source of the FET 5 and generates a self bias in the gate of the FET 5. The drain of the FET 5 serves as the output of the auxiliary circuit 6 and is connected to the anode electrode of the LD 2. The differentiator 9 generates a pulse signal S3 synchronized with the leading edge and the falling edge of the signal $S_{IN}$ (detailed later) and its time constant is determined by the transmission rate of the signal $S_{IN}$ and the value of a terminator of a transmission line including the lead pin P1. In this embodiment, the cut-off frequency is set to approximately 8 GHz assuming that the resistor 7 is 20 Ω and the capacitor 8 is 1 pF.

Operation of the transmitter optical module 1 explained above will be described referring to FIG. 2.

Figure 2A:
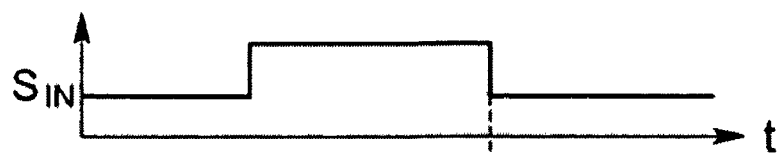
FIG. 2 is a time chart illustrating the features of an auxiliary circuit in the transmitter optical subassembly shown in FIG. 1.
Figure 2B:
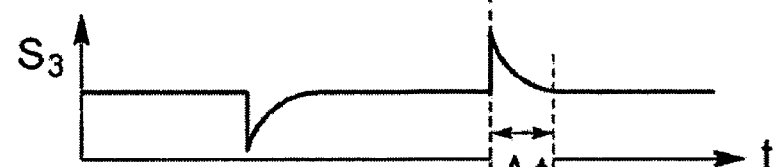
Figure 2C:
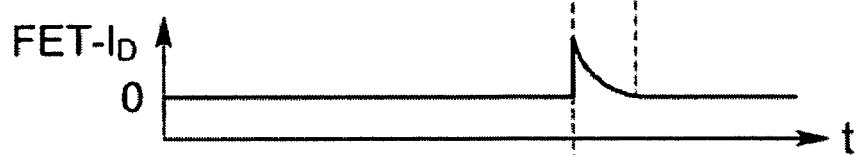
Figure 2D:
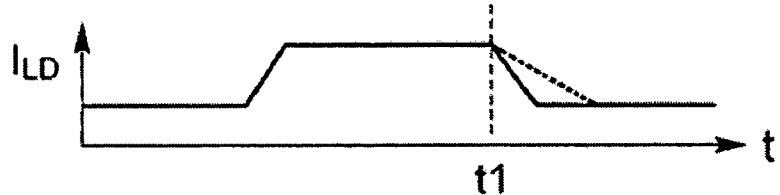

When the signal $S_{IN}$ is input to the driver 4 (FIG. 2A), the output S1 becomes an inversion of the signal $S_{IN}$. The input S3 of the FET 5 is obtained by differentiating the signal S1 as shown in FIG. 2I. That is, a negative and positive pulses are generated in synchronous with the leading edge and the falling edge of the output S1, respectively. Since the FET 5 is self-biased by the diode 10, the drain current of the FET 5 is not influenced in the stable state except the leading edge and the falling edge of the signal S1 and by a negative pulse from the differentiator. Only when a positive pulse is applied to the gate of the FET 5, that is, only on the falling edge of the input signal $S_{IN}$, the drain current of the FET 5 increases in the shape of a pulse (FIG. 2C).

For the LD 2, the current supplied from power supply Vcc flows through the LD 2 and is sunk into the output of the driver 4 through the lead pin P1 in response to the output of the driver 4. In the driving, influenced by the junction capacitance of the LD 2 and the inductance of the lead pin, the waveform $I_{LD}$ supplied to the LD 2 shows its falling edge delayed compared with the leading edge as shown in the dotted line in FIG. 2D. In this invention, the auxiliary circuit 6 is installed within the package PKG and the auxiliary circuit is driven by the output S1 of the driver 4 so that a drain current ID is generated in a pulse shape on the FET 5 of the auxiliary circuit 6 only on the leading edge of the output S1 (on the falling edge of the input signal $S_{IN}$) as shown in FIG. 2C. The drain current ID bypasses a portion of the current $I_{LD}$ supplied from the power supply to the LD 2. Thus, the falling edge of the current $I_{LD}$ supplied to the LD becomes steeper as shown by the solid line in FIG. 2D.

According to the above transmitter optical subassembly 3 and the transmitter optical module 1, even when the falling edge of the current $I_{LD}$ flowing through the LD 2 is delayed due to the influence of the interconnection connecting the driver 4 and the package PKG, especially due to the inductance component at the lead pin on the anode electrode of the LD 2 and the junction capacitance of the LD 2, a pulse current is generated on the FET 5 of the auxiliary circuit 6 and this current bypasses a portion of the current supplied to the LD 2 thereby making steeper the falling edge of the current flowing through the LD 2. It is thus possible to obtain the high-speed configuration of the transmitter optical subassembly 3 by only installing a single active device (FET 5) within the package PKG. The current flowing through the FET 5 is a pulse current that occurs only at the transition of the driving signal so that the power consumption in the package PKG is not increased.

The capacitor 8 has a capacitance of a some picofarads at most and small dimensions. When the current supplied to the LD 2 is on the order of 60 mA, a small-sized FET 5 will be sufficient. The resistor in the differentiator 9 also serves as a terminator of the transmission line viewed from the output of the driver 4 so that it may be chosen to a small value of several tens of ohms, thus being less influenced by a parasitic capacitance. The influence of the parasitic capacitance is represented by a circuit parallel to the resistor so that the time constant of the parallel circuit corresponds to a much higher frequency. The auxiliary circuit 6 does not require a power source thus no additional lead pins are required.

Figure 3:
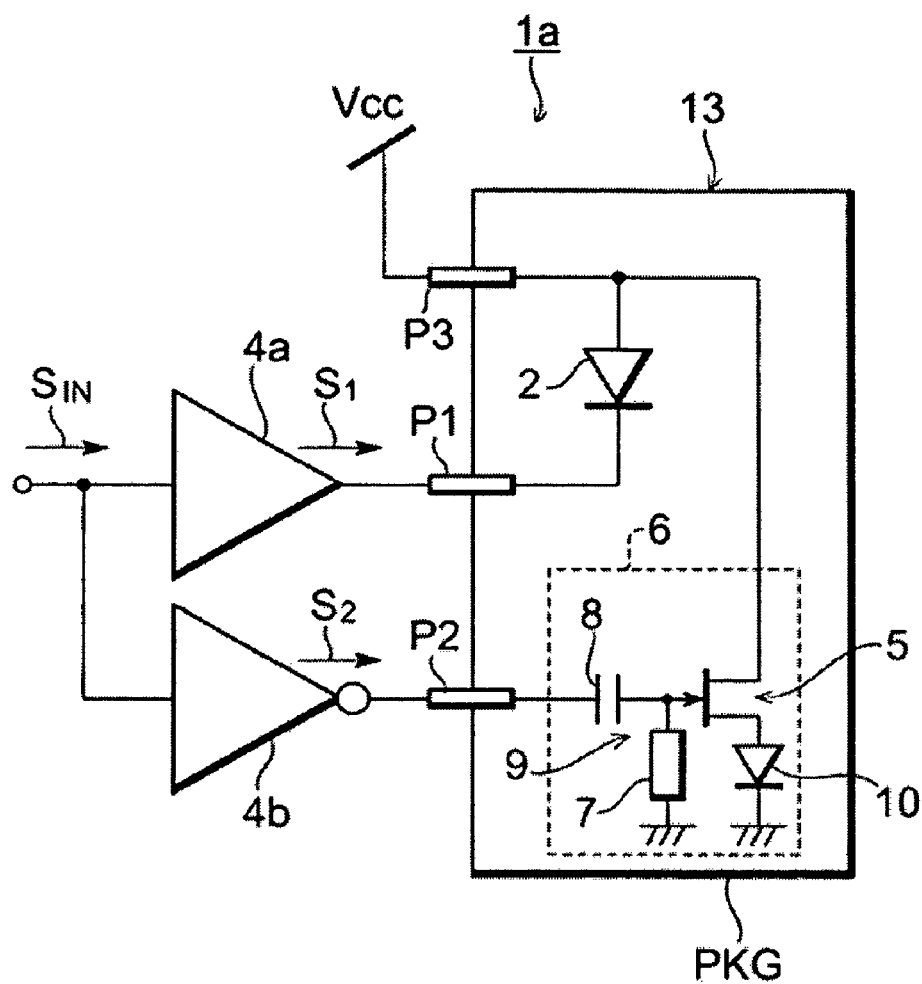
FIG. 3 is a circuit diagram showing a variation of the first embodiment.

FIG. 3 shows the configuration of a transmitter optical subassembly 13 and a transmitter optical module 1a installing the transmitter optical subassembly 13 according to a variation of the first embodiment. The variation differs from the circuit shown in FIG. 1 in terms of the configuration of the driver 4. This variation has a first driver 4a and a second driver 4b. The first driver 4a supplies an in-phase output S1 with the driving signal $S_{IN}$ to the LD 2 through a lead pin P1. The second driver 4b supplies an out-phase output S2 with the driving signal $S_{IN}$ to the auxiliary circuit 6 through a lead pin P2. The configuration of the package PKG is similar to that shown in FIG. 1 except that separate lead pins are provided respectively for the in-phase signal S1 and the out-phase signal S2.

In this variation, the driving signal S2 of the auxiliary circuit 6 and the driving signal S2 of the LD 2 are provided separately so that the freedom to design the auxiliary circuit 6 increases. Specifically, in the auxiliary circuit 6 shown in FIG. 1, the resistor 7 in the differentiator 9 works as a terminator of a transmission line. The transmission line also serves as a transmission line to the LD 2. The terminator viewed from the transmission line is determined in a complex fashion by the resistor 7, operating resistance of the LD 2, and the input resistance of the FET 5. The output of the driver 4 is directed to the LD 2 and the auxiliary circuit 6. When the optimum driving conditions are not fully consistent with those of the auxiliary circuit 6, the operation of the transmitter optical subassembly 3 could be unstable.

In this variation, it is possible to set individually optimum conditions for the LD 2 and the auxiliary circuit 6. The load on the second driver 4b is provided by a parallel circuit of the resistor 7 and the input resistance of the FET 5. The input resistance is much larger than that of the resistor 7 because the input of the PET 5 is self-biased (inversely biased) by the diode 10. Thus, the value of a terminator may be substantially determined by the resistor 7 alone. When the resistor 7 is determined, the value of the capacitor 8 is automatically determined from the value of a time constant required for the differentiator 9. For the output transmission line of the first driver 4a, only the LD 2 is connected. When the operating resistance of the LD 2 is below the characteristic impedance of the transmission line, it is possible to satisfy the impedance matching conditions simply by serially inserting a resistor into the LD 2.

Second Embodiment

A second embodiment of the invention is described below.

Figure 4:
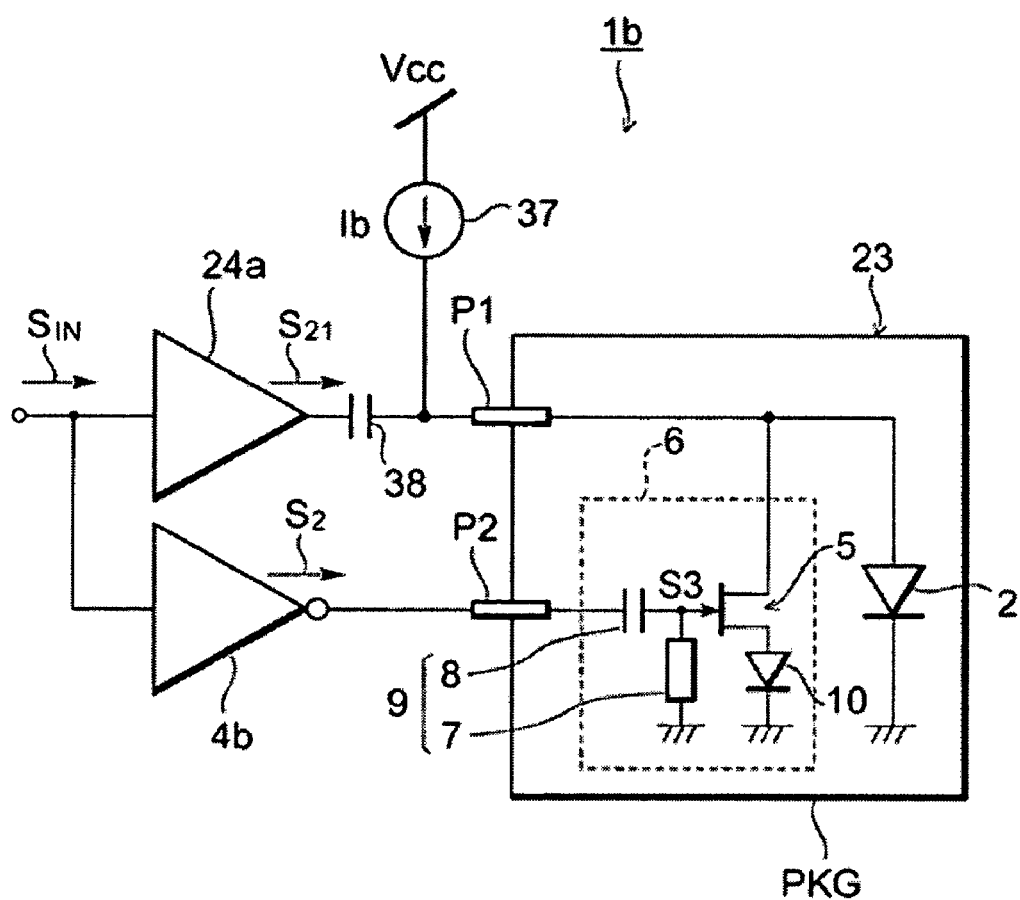
FIG. 4 shows the circuit configuration of a transmitter optical subassembly and a transmitter optical module according to a second embodiment.

FIG. 4 shows the configuration of a transmitter optical module 1b including a transmitter optical subassembly 23 according to the second embodiment of the invention. The transmitter optical module 1b according to this embodiment differs from the variation of the first embodiment in that a driver 24a to drive an LD is a voltage-driving type, That is, the driver 24a receives a signal $S_{IN}$ and generates a voltage signal S21 as a driving signal to drive the LD 2. The driver 24a is connected to the anode electrode of the LD 2 and the drain of an FET 5 through a coupling capacitor 38 and the lead pin P1 of a CAN-type package PKG. Further, the lead pin P1 is connected to a current source 37 for supplying a bias current 1b to the LD 2 outside the package PKG. Same as the first embodiment, the second driver 4b receives a driving signal $S_{IN}$ and supplies a signal S2 phase-inverted from the driving signal $S_{IN}$ to the auxiliary circuit 6 through a lead pin P2. The LD 2 is connected between the lead pin P1 and the ground in the package PKG.

In the circuit shown in FIG. 4, the current source 37 may be connected to the anode electrode of the LD 2 through another lead pin P3. That is, while the output of the first driver 24a is superimposed with the current 1b from the current source 37 and supplied to the anode electrode of the LD 2 through the lead pin P1 in FIG. 4, a lead pin P3 for supplying a bias current may be provided separately from the lead pin P1 and the both pins may be connected together in the package PKG to supply the bias current 1b superimposed with the signal S21 to the anode electrode of the LD 2. In this case, it is preferable to interpose an inductor or a resistor between the new lead pin P3 and the anode electrode of the LD 2 in order to weaken the influence of the current source 37 on the transmission line from the first driver 24a.

The operation of this embodiment will be described. When a signal $S_{IN}$ is input to the first driver 24a and the second driver 4b, a driving signal S21 in-phase with the signal $S_{IN}$ is generated in the first driver 24a and a signal S2 out-phase with the signal $S_{IN}$, is generated in the second driver 4b. The signal S21 and the signal S2 are voltage signals. When the signal S2 is input to the auxiliary circuit 6, a pulse signal 33 is generated in synchronous with the leading edge and the falling edge of the signal S2. When the pulse signal S3 is input to the FET 5, a pulse-shaped drain current is generated corresponding to the pulse signal synchronized with the leading edge of the signal S2 (equivalent to the falling edge of the signal S21) because the FET 5 is self-biased by the diode 10. As a result, same as the first embodiment, the leading edge of the supply current to the LD 2 appears faster.

As the drivers 24a, 24b of the transmitter optical module 1b, a differential circuit may be used. That is, the cathode electrode of the LD 2 is grounded through a resistor or an inductor instead of the direct grounding and the in-phase output (one output) of the differential circuit is connected to the anode electrode of the LD 2 through the lead pin P1 while the out-phase (the other output) of the differential circuit is connected to the gate of the FET 5 and the cathode electrode of the LD 2. With this circuit configuration, it is possible to independently control the amplitudes of the in-phase output and the out-phase output of the differential circuit. This allows the control of the FET 5 of the auxiliary circuit 6 at the same time with driving of the LD 2.

Figure 5:
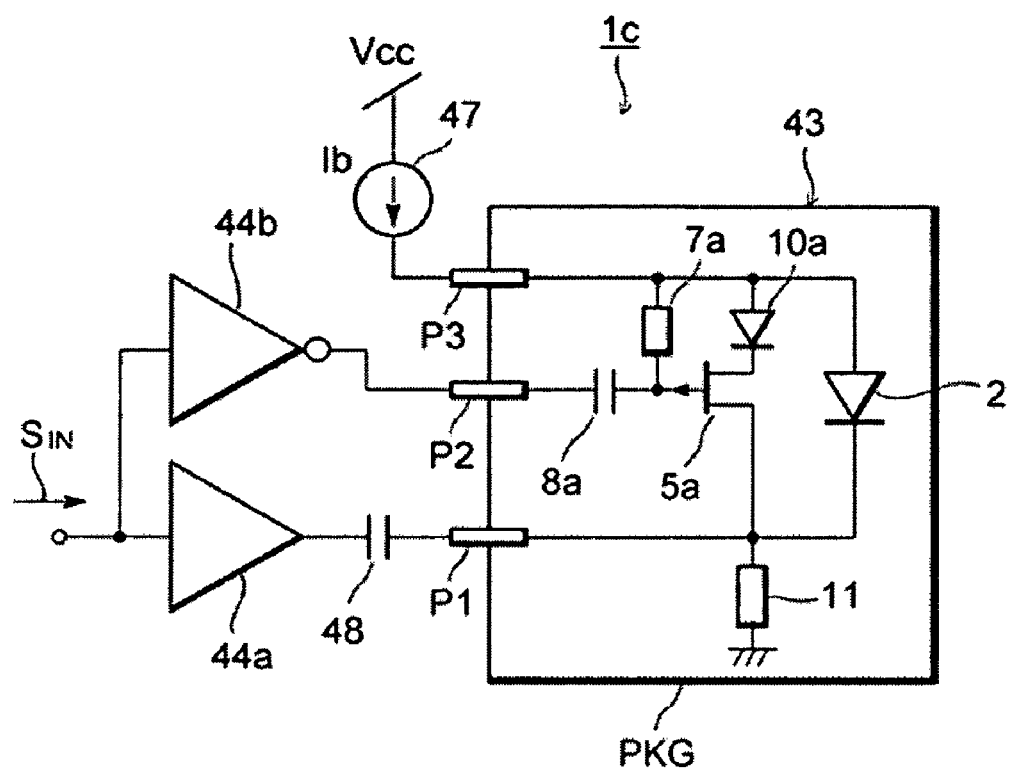
FIG. 5 is a circuit diagram showing a variation of the second embodiment.
Figure 6:
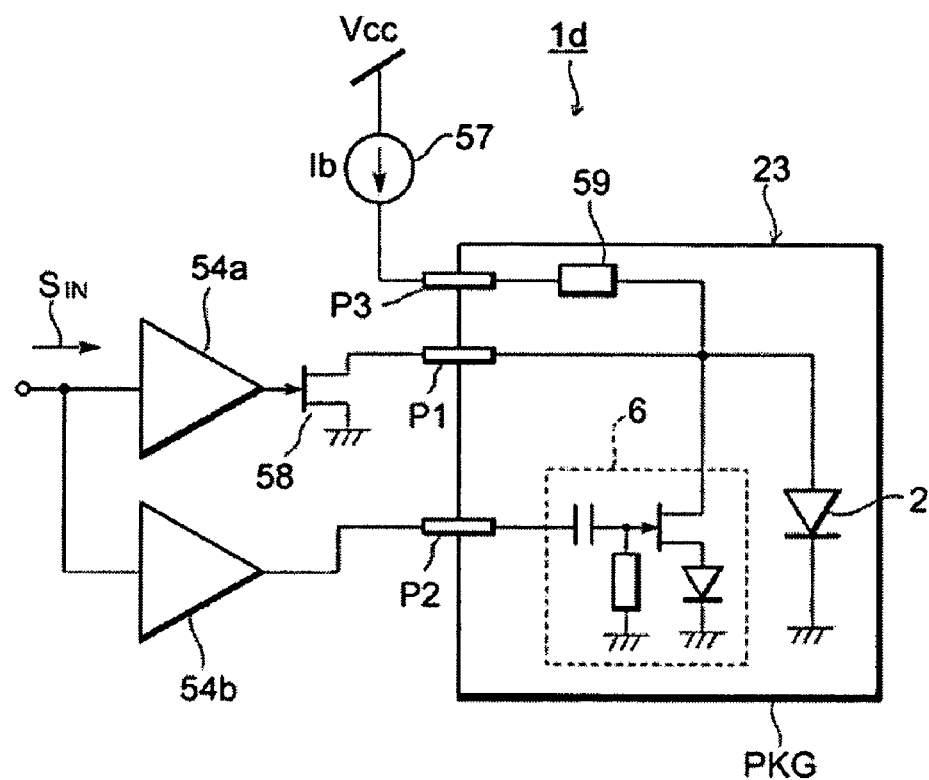
FIG. 6 is a circuit diagram showing another variation of the second embodiment.
Figure 7:
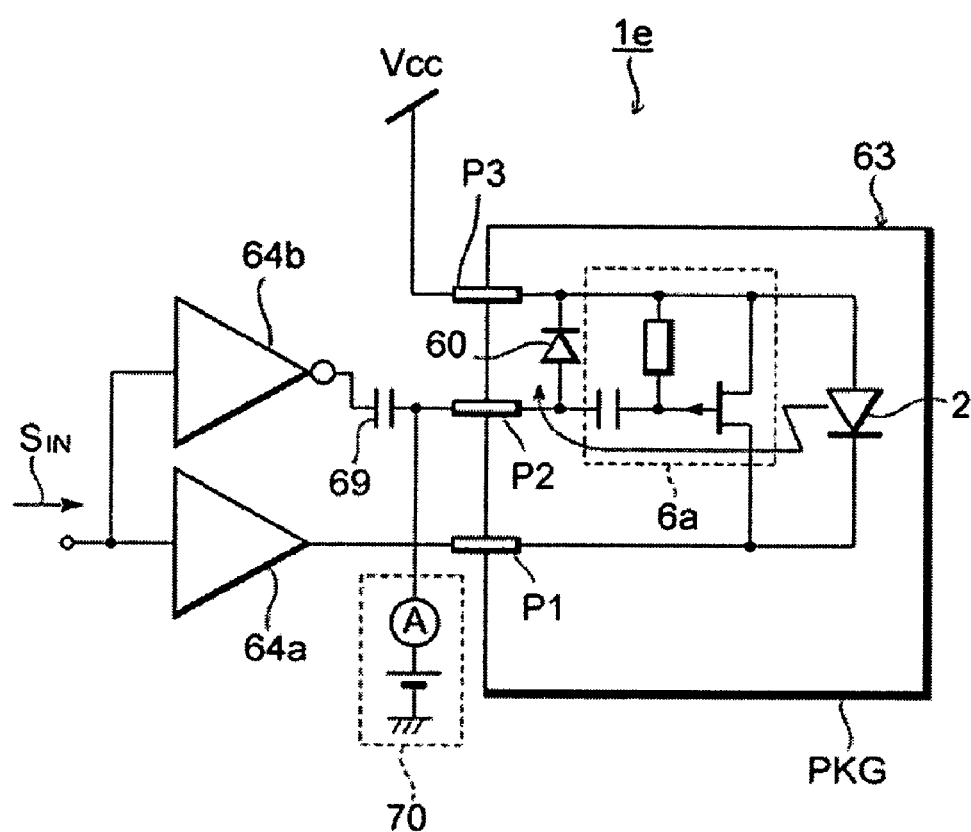
FIG. 7 is a circuit diagram showing still another variation of the second embodiment.

Preferable embodiments of the invention are described referring to drawings. Note that the invention is not limited to the circuits illustrated in a series of drawings but various changes can be made without departing from the spirit of the invention. FIGS. 5 to 7 show such variations.

While the transition from the lighting state to the non-lighting state is boosted by discharging the anode electrode of the LD 2 to a ground potential in the first embodiment, the transition from the lighting state to the non-lighting state is boosted by artificially bypassing the anode electrode and cathode electrode of the LD 2 in a transmitter optical subassembly 43 and a transmitter optical module 1c according to the variation shown in FIG. 5. In the circuit of FIG. 5, a signal out-phase with the driving signal $S_{IN}$ is input to a p-FET 5a to bypass a current flowing through the LD 2. While the cathode electrode of the LD 2 is grounded by an inductor 11 and a driving signal is supplied to the cathode electrode of the LD 2 through a coupling capacitor 48 in FIG. 5, the cathode electrode of the LD 2 may 5 be directly coupled to the first driver to current drive the LD 2. This example provides a current source 47 for supplying the 5 bias current of the LD 2 outside the package PKG.

FIG. 6 is a circuit diagram showing a transmitter optical module 1d including an optical transmitter 23, the module providing an FET for shunt driving the LD 2 outside the package PKG according to a variation of the second embodiment. It is preferable to install within the package PKG an inductor or a resistor 39 between the anode electrode of the LD 2 and a bias current source 57. This is to prevent the degradation of the transmission characteristic of a driving signal supplied to the LD 2 in the frequency response of the power supply Vcc.

While a driving FET is arranged outside the package PKG in this variation, the driving FET may be installed within the package. In this case, a signal lead pin may be shared by two driving systems. Specifically, a first and second drivers 54a, 54b are used in common and the outputs are brought into the package PKG through the lead pin P1. In the package PKG, one output is input to the gate of the driving FET and the other to the auxiliary circuit 6. The FET of a differentiator 9 is self-biased by the diode 10 while the source of a driving FET 58 is grounded, so that the independent bias conditions may be also set to two FETs in this variation.

A monitor PD (photoreceptor device) for monitoring the intensity of optical output from the LD 2 may be installed within the transmitter optical package PKG. FIG. 7 is a circuit diagram of an optical module 1e including a monitor PD 60 and an optical transmitter 63 in the example of FIG. 5. To the wiring from the lead pin P2 connected to the gate terminal (input terminal) of the FET in the auxiliary circuit 6a is connected the anode electrode of the PD 60. Also, to the lead pin P2 is connected the output of the second driver 64b through ED the coupling capacitor 69 and an APC circuit 70 for detecting the monitor current output from the PD 60.

With this configuration, the lead pin P2 is simultaneously applicable to more than one usage, that is, to the output of a monitor current from the PD 60 and to a signal to a differentiator 9 thus implementing a new feature without increasing the number of lead pins. The monitor PD 60 is used to control the average optical output power of the LD 2 and its operational speed is sufficiently lower than the transmission rates which eliminates the interference to the transmission signal.

Further, it is possible to provide a transistor for generating a pulse signal synchronized with the leading edge of the supplied current to the LD 2 such as the FET 5a in the auxiliary circuits 6, 6a, in place of a transistor for generating a pulse current synchronized with the falling edge of the supplied current to the LD 2, or in addition to such a transistor.

What is claimed is:

1. A transmitter optical module for generating an optical signal corresponding to a received electrical signal, comprising:
    a first driver for receiving the electrical signal and for outputting a first driving signal;
    a second driver for receiving the electrical signal and for outputting a second driving signal;
    a current source for generating a bias current; and
    a transmitter optical subassembly for receiving the first and second driving signals and for generating the optical signal,
    the transmitter optical subassembly including:
    a semiconductor laser diode for receiving the first driving signal in an anode electrode thereof;
    an auxiliary circuit, by receiving the second driving signal, for generating a transient current in the anode electrode of the semiconductor laser diode in synchronous with a leading edge of the second driving signal; and
    a CAN-type package for installing the semiconductor laser diode and the auxiliary circuit therein and the first and second drivers and the current source externally, the package providing a first lead pin for supplying the first driving signal superposed with the bias current to the anode electrode of the semiconductor laser diode and a second lead pin for supplying the second driving signal to the auxiliary circuit, wherein
    the semiconductor laser diode is connected between the first lead pin and the ground.

2. The transmitter optical module according to claim 1, wherein
    the auxiliary circuit comprises:
    a differentiator for differentiating the second driving signal, and
    a transistor for generating the transient current by receiving an output of the differentiator.

3. The transmitter optical module according to claim 2, wherein
    the transistor generates the transient current in synchronous with the leading edge of the second driving signal.

4. The transmitter optical module according to claim 2, wherein
    the transistor generates the transient current in synchronous with the falling edge of the first driving signal.

5. The transmitter optical module according to claim 1 wherein the first driving signal is in-phase and the second driving signal is out-of-phase with the received electrical signal.

* * * * *